US008361823B2

(12) United States Patent
Kahen

(10) Patent No.: US 8,361,823 B2
(45) Date of Patent: *Jan. 29, 2013

(54) LIGHT-EMITTING NANOCOMPOSITE PARTICLES

(75) Inventor: Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 350 days.

This patent is subject to a terminal disclaimer.

(21) Appl. No.: 11/770,833

(22) Filed: Jun. 29, 2007

(65) Prior Publication Data

US 2009/0001349 A1 Jan. 1, 2009

(51) Int. Cl.
*H01L 21/00* (2006.01)

(52) U.S. Cl. .................... 438/47; 257/42; 257/E31.027; 977/773

(58) Field of Classification Search .................. 977/773, 977/774, 949–952, 954, 882, 890–892, 778–787; 257/9–39, 79–103, E33.003, E21.352, 33.001–33.077; 438/22–47, 64–73
See application file for complete search history.

(56) References Cited

U.S. PATENT DOCUMENTS

| | | | | |
|---|---|---|---|---|
| 5,537,000 | A | 7/1996 | Alivisatos et al. | |
| 6,838,816 | B2 | 1/2005 | Su et al. | |
| 7,615,800 | B2 * | 11/2009 | Kahen | 257/103 |
| 2003/0222572 | A1 | 12/2003 | Su et al. | |
| 2004/0004982 | A1 * | 1/2004 | Eisler et al. | 372/43 |
| 2005/0206300 | A1 * | 9/2005 | Perlo et al. | 313/498 |
| 2005/0214967 | A1 * | 9/2005 | Scher et al. | 438/63 |
| 2006/0236918 | A1 * | 10/2006 | Jun et al. | 117/68 |
| 2007/0012355 | A1 * | 1/2007 | LoCascio et al. | 136/252 |
| 2007/0057263 | A1 | 3/2007 | Kahen | |
| 2007/0138932 | A1 * | 6/2007 | Morioka et al. | 313/485 |

FOREIGN PATENT DOCUMENTS

| | | |
|---|---|---|
| WO | 2007/037882 | 4/2007 |
| WO | 2007/067257 | 6/2007 |

OTHER PUBLICATIONS

Chen et al. Chem. Rev. 2007, 107, 2891-2959.*
Tang et al, Organic electroluminescent diodes, Appl. Phys. Lett. 51, 913-915 (1987).
Burroughes et al., Light-emitting diodes based on conjugated polymers, Nature 347, 539-541 (1990).
Matoussi et al., Electroluminescence from heterostructures of poly(phenylene vinylene) and inorganic CdSe nanocrystals J. Appl. Phys. 83, 7965 (1998).
Hikmet et al., Study of conduction mechanism and electroluminescence in CdSe/Zns quantum dot composites, J. Appl. Phys. 93, 3509-3514 (2003).
Coe et al., Electroluminescence from single monolayers of nanocrystals in molecular organic devices, Nature 420, 800-802 (2002).

(Continued)

*Primary Examiner* — Julio J Maldonado
*Assistant Examiner* — Sonya McCall Shepard
(74) *Attorney, Agent, or Firm* — Raymond L. Owens

(57) ABSTRACT

A method of making an inorganic light emitting layer includes combining a solvent for semiconductor nanoparticle growth, a solution of core/shell quantum dots, and semiconductor nanoparticle precursor(s); growing semiconductor nanoparticles to form a crude solution of core/shell quantum dots, semiconductor nanoparticles, and semiconductor nanoparticles that are connected to the core/shell quantum dots; forming a single colloidal dispersion of core/shell quantum dots, semiconductor nanoparticles, and semiconductor nanoparticles that are connected to the core/shell quantum dots; depositing the colloidal dispersion to form a film; and annealing the film to form the inorganic light emitting layer.

15 Claims, 6 Drawing Sheets

OTHER PUBLICATIONS

Mueller et al., Multicolor Light-Emitting Diodes Based on Semiconductor Nanocrystals Encapsulated in GaN Charge Injection Layers, Nano Letters 5, 1039-1044 (2005).
S. Nakamura et al., Bright electroluminescence from CdS quantum dot LED structures, Electron. Lett. 34, 2435-2436 (1998).
R. Rossetti et al., Quantum size effects in the redox potentials, resonance Raman spectra, and electronic spectra of CdS crystallites in aqueous solution, J. Chem. Phys. 79, 1086-1087 (1983).
R. Xie et al., Synthesis and Characterization of Highly Luminescent CdSe-Core CdS/$ZN_{0.5}Cd_{0.5}S$/ZnS Multishell Nanocrystals J. Am. Chem. Soc. 127, 74807488 (2005).
X. Peng et al., Epitaxial Growth of Highly Luminescent CdSe/CdS Core/Shell Nanocrystals with Photostability and Electronic Accessibility J. Am. Chem. Soc. 119, 7019-7029 (1997).
O. Masala and R. Seshadri, Synthesis Routes for Large Volumes of Nanoparticles Annu. Rev. Mater. Res. 34, 41-81 (2004).
A. A. Bol et al., Factors Influencing the Luminescence Quantum Efficiency of Nanocrystalline ZnS:Mn2+, Phys. Stat. Sol. B224, 291-296 (2001).
R. Rossetti et al., Size effects in the excited electronic states of small colloidal CdS crystallites, J. Chem. Phys. 80, 4464-4469 (1984.
M. A. Hines et al., Synthesis and Characterization of Strongly Luminescing ZnS-Capped CdSe Nanocrystals, J. Phys. Chem. 100, 468-471 (1996).
A. R. Kortan et al., Nucleation and Growth of CdSe on ZnS Quantum Crystalline Seeds, and Vice Verse, in Inverse Micelle Media. Am. Chem. Soc. 112, 1327-1332 (1990).
C. B. Murray et al., Synthesis and Characterization of Monodisperse Nanocrystals and Close-Packed Nanocrystal Assemblies, Annu. Rev. Mater. Sci. 30, 545-593 (2000).
A. N. Goldstein et al., Melting in Semiconductor Nanocrystals, Science 256, 1425-1426 (1992).
S. B. Qadri et al., Size-induced transition-temperature reduction in nanoparticles of ZnS, Phys. Rev B60, 9191-9193 (1999).
S. A. Ivanov et al., Light-Amplification Using Inverted Core/Shell Nanocrystals: Towards Lasing in the Single-Exicton Regime, J. Phys. Chem. 108, 10625-10630 (2004).
D. V. Talapin et al., CdSe/CdS/ZnS and CdSe/ZnSe/ZnSe/Zns Core-Shell-Shell Nanocrystals, J. Phys. Chem. 108, 1882618831 (2004).
K. B. Kahen, Rigorous optical modeling of multilayer organic light-emitting diode devices, Appl. Phys. Lett. 78, 1649-1651 (2001).
S. W. Lim, High p-type doping of ZnSe using Li3N diffusion, Appl. Phys. Lett. 65, 2437-2438 (1994).
Pradham et al, Colloidal CdSe Quantum Wires by Oriented Attachment, Nano Letters, vol. 6, No. 4, pp. 720-724, 2006.
A. A. Khosravi et al., Manganese doped zinc sulphide nanoparticles by aqueous method, Appl. Phys. Lett. 67, 2506-2508 [1995].
Letters toNature, vol. 423, Jun. 5, 2003, Universal Alignment of Hydrogenlevels in Semiconductors, Insurlators and Solutions, Chris G. Van De Walle & J. Neugebauer, p. 626-628.
J. Phys. Chem, 1996, 100, 13061-13078, Physical chemistry of Semicondcutor—Liquid Interfaces, arther J. Nozik, RudigerMemming.

* cited by examiner

LIGHT-EMITTING NANOCOMPOSITE PARTICLES

STATEMENT REGARDING FEDERALLY-SPONSORED RESEARCH OR DEVELOPMENT

This invention was made with Government support under Cooperative Agreement #DE-FC26-06NT42864 awarded by DOE. The Government has certain rights in this invention.

CROSS-REFERENCE TO RELATED APPLICATIONS

Reference is made to commonly assigned U.S. patent application Ser. No. 11/668,041 filed Jan. 29, 2007, entitled "Doped Nanoparticle Semiconductor Charge Transport Layer" by Keith B. Kahen; U.S. patent application Ser. No. 11/677,794 filed Feb. 23, 2007, entitled "Ex-Situ Doped Semiconductor Transport Layer" by Keith B. Kahen; and U.S. patent application Ser. No. 11/678,734 filed Feb. 26, 2007, entitled "Doped Nanoparticle-Based Semiconductor Junction" by Keith B. Kahen, the disclosures of which are incorporated herein.

BACKGROUND OF THE INVENTION

Semiconductor light emitting diode (LED) devices have been made since the early 1960s and currently are manufactured for usage in a wide range of consumer and commercial applications. The layers comprising the LEDs are based on crystalline semiconductor materials that require ultra-high vacuum techniques for their growth, such as, metal organic chemical vapor deposition (MOCVD). In addition, the layers typically need to be grown on nearly lattice-matched substrates in order to form defect-free layers. These crystalline-based inorganic LEDs have the advantages of high brightness (due to layers with high conductivities), long lifetimes, good environmental stability, and good external quantum efficiencies. The usage of crystalline semiconductor layers that results in all of these advantages, also leads to a number of disadvantages. The dominant ones are high manufacturing costs, difficulty in combining multi-color output from the same chip, and the need for high cost and rigid substrates.

In the mid 1980s, organic light emitting diodes (OLED) were invented (Tang et al, Appl. Phys. Lett. 51, 913 (1987)) based on the usage of small molecular weight molecules. In the early 1990s, polymeric LEDs were invented (Burroughes et al., Nature 347, 539 (1990)). In the ensuing 15 years organic based LED displays have been brought out into the marketplace and there has been great improvements in device lifetime, efficiency, and brightness. For example, devices containing phosphorescent emitters have external quantum efficiencies as high as 19%; whereas, device lifetimes are routinely reported at many tens of thousands of hours. In comparison to crystalline-based inorganic LEDs, OLEDs have much reduced brightness (mainly due to small carrier mobilities), shorter lifetimes, and require expensive encapsulation for device operation. On the other hand, OLEDs enjoy the benefits of potentially lower manufacturing cost, the ability to emit multi-colors from the same device, and the promise of flexible displays if the encapsulation issue can be resolved.

To improve the performance of OLEDs, in the later 1990s, OLED devices containing mixed emitters of organics and quantum dots were introduced (Matoussi et al., J. Appl. Phys. 83, 7965 (1998)). The virtue of adding quantum dots to the emitter layers is that the color gamut of the device could be enhanced; red, green, and blue emission could be obtained by simply varying the quantum dot particle size; and the manufacturing cost could be reduced. Because of problems, such as, aggregation of the quantum dots in the emitter layer, the efficiency of these devices was rather low in comparison with typical OLED devices. The efficiency was even poorer when a neat film of quantum dots was used as the emitter layer (Hikmet et al., J. Appl. Phys. 93, 3509 (2003)). The poor efficiency was attributed to the insulating nature of the quantum dot layer. Later the efficiency was boosted (to ~1.5 cd/A) upon depositing a monolayer film of quantum dots between organic hole and electron transport layers (Coe et al., Nature 420, 800 (2002)). It was stated that luminescence from the quantum dots occurred mainly as a result of Forster energy transfer from excitons on the organic molecules (electron-hole recombination occurs on the organic molecules). Regardless of any future improvements in efficiency, these hybrid devices still suffer from all of the drawbacks associated with pure OLED devices.

Recently, a mainly all-inorganic LED was constructed (Mueller et al., Nano Letters 5, 1039 (2005)) by sandwiching a monolayer thick core/shell CdSe/ZnS quantum dot layer between vacuum deposited (MOCVD) n- and p-GaN layers. The resulting device had a poor external quantum efficiency of 0.001 to 0.01%. Part of that problem could be associated with the organic ligands of trioctylphosphine oxide (TOPO) and trioctylphosphine (TOP) that were reported to be present post growth. These organic ligands are insulators and would result in poor electron and hole injection onto the quantum dots. In addition, the remainder of the structure is costly to manufacture due to the usage of electron and hole semiconducting layers grown by high vacuum techniques, and the usage of sapphire substrates.

Alivisatos et al., U.S. Pat. No. 5,537,000, the entire disclosure of which is incorporated herein by reference, describe an electroluminescent device wherein the light-emitting layer includes semiconductor nanocrystals (quantum dots) that are formed into one or more monolayers. The monolayers are formed, for example, by use of multifunctional linking agents which cause the nanocrystals to bond to the linking agent which, in turn, bonds to the substrate or support, to form the first monolayer. Linking agents can then be used again to bond the first monolayer of nanocrystals to a subsequent nanocrystal monolayer. Useful linking agents include difunctional thiols, and linking agents containing a thiol group and a carboxyl group. Organic linking agents are poor conductors of electrons and holes. Thus, Alivisatos et al. does not provide a sufficient means of conducting carriers into the light-emitting layer and further into the quantum dots in order to achieve efficient light emission.

Su et al., U.S. Pat. No. 6,838,816, the entire disclosure of which is incorporated herein by reference, describes a method for fabricating a light-emitting source using luminescent colloid nanoparticles (quantum dots). The colloid nanoparticles can be dispersed homogeneously in liquid that can be coated on a substrate to from a light-emitting layer. In certain cases, $SiO_2$ particles are added to the layer of colloidal nanoparticles and the layer is annealed. Adding these particles aids in sealing the layer and protecting the quantum dots from interaction with environmental oxygen. The light-emitting layer is incorporated into an LED, however, the light-emission obtained is not sufficiently high since the method of Su et al. also does not provide a good means for conduction of electrons and hole within the light-emitting layer and into the quantum dot emitters.

Kahen, U.S. Patent Application Publication No. 2007/0057263, the entire disclosure of which is incorporated herein by reference, describes an inorganic light-emitting layer formed from a colloidal dispersion of core/shell quantum dot emitters and semiconductor nanoparticles. Core/shell quantum dots were prepared with non-volatile ligands that can withstand the temperatures used in their synthesis. The quantum dots were separated from the solvent used in the synthesis and the non-volatile ligands were exchanged for volatile ligands. A new colloidal dispersion was prepared by mixing a dispersion of core/shell quantum dots having volatile ligands and a dispersion of semiconductor nanoparticles; this new dispersion was applied to a substrate and annealed. Annealing performs two functions: it removes the volatile ligands and transforms the nanoparticles into a semiconductor matrix. The semiconductor matrix provides a conductive path that can facilitate the injection of a hole or an election into the light-emitting layer and into the core of a quantum dot; subsequent recombination of holes and electrons provides efficient light emission.

Ligand exchange requires separation of quantum dots from a solvent, which can be difficult, since the quantum dots are extremely small. For example, attempts to separate quantum dots by centrifugation of a colloid dispersion may precipitate only a fraction of the dots, even after prolonged times. In addition, if very high centrifugation speeds are employed, it can be very difficult to re-disperse the resulting tightly-packed quantum dot precipitate.

Accordingly, it would be highly beneficial to have a high yield process for forming a colloidal dispersion containing quantum dot emitters for use in coating a light-emitting layer. Furthermore, it would be beneficial to construct an all inorganic LED using this colloidal dispersion and low cost deposition techniques. Additionally, it is desirable to have an all inorganic LED whose individual layers have good conductivity performance. The resulting LED would combine many of the desired attributes of crystalline LEDs and organic LEDs.

SUMMARY OF THE INVENTION

In accordance with one aspect of the present invention a method is provided for making an inorganic light emitting layer comprising:

(a) combining a solvent for semiconductor nanoparticle growth, a solution of core/shell quantum dots, and semiconductor nanoparticle precursor(s);

(b) growing semiconductor nanoparticles to form a crude solution of core/shell quantum dots, semiconductor nanoparticles, and semiconductor nanoparticles that are connected to the core/shell quantum dots;

(c) forming a single colloidal dispersion of core/shell quantum dots, semiconductor nanoparticles, and semiconductor nanoparticles that are connected to the core/shell quantum dots;

(d) depositing the colloidal dispersion to form a film; and (e) annealing the film to form the inorganic light emitting layer.

In another aspect of the present invention a light-emitting nanocomposite particle comprises a nanoparticle connected to a core/shell quantum dot.

An advantage of the present invention includes providing a way of forming a light-emitting layer, that is simultaneously luminescent and conductive, whose emitting species are quantum dots. The light-emitting layer includes a composite of conductive wide band gap nanoparticles and shelled quantum dot emitters connected to the nanoparticles. A thermal anneal is used to sinter the conductive nanoparticles amongst themselves and to enhance the electrical connection between the conductive nanoparticles and the surface of the quantum dots. As a result, the conductivity of the light-emitting layer is enhanced, as is electron-hole injection into the quantum dots. To enable the quantum dots to survive the anneal step without a loss in their fluorescent efficiency (since the organic ligands passivating the quantum dots boil away during the anneal process), the quantum dot shells are engineered to confine the electrons and holes, such that, their wave functions do not sample the surface states of the outer inorganic shell.

It is also an advantage of the present invention to incorporate the conductive and luminescent light-emitting layer in an all inorganic light emitting diode device. In one embodiment, electron and hole transport layers are composed of conductive nanoparticles; in addition, separate thermal anneal steps are used to enhance the conductivities of these layers. All of the nanoparticles and quantum dots connected to the nanoparticles are synthesized chemically and made into colloidal dispersions. Consequently, all of the device layers are deposited by low cost processes, such as, drop casting or inkjetting. The resulting all inorganic light-emitting diode device is low cost, can be formed on a range of substrates, and can be tuned to emit over a wide range of visible and infrared wavelengths. In comparison to organic-based light emitting diode devices, its brightness should be enhanced and its encapsulation requirements should be reduced.

DETAILED DESCRIPTION OF THE INVENTION

Using quantum dots as the emitters in light emitting diodes confers the advantage that the emission wavelength can be simply tuned by varying the size of the quantum dot particle. As such, spectrally narrow (resulting in a larger color gamut), multi-color emission can occur from the same substrate. If the quantum dots are prepared by colloidal methods (and not grown by high vacuum deposition techniques (S, Nakamura et al., Electron. Lett. 34, 2435 (1998))), then the substrate no longer needs to be expensive or lattice matched to the LED semiconductor system. For example, the substrate could be glass, plastic, metal foil, or Si. Forming quantum dot LEDs using these techniques is highly desirably, especially if low cost deposition techniques are used to deposit the LED layers.

Figure 1A:
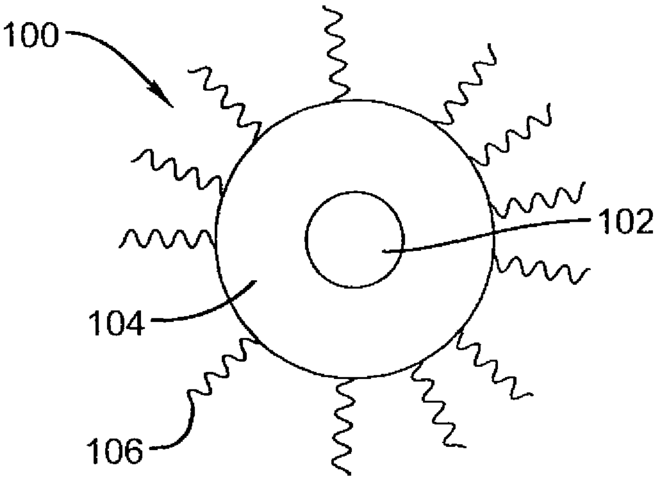
FIG. 1a Prior Art
FIG. 1*a* shows a schematic view of a prior art core/shell quantum dot.

A schematic representation of a core/shell quantum dot emitter 100 is shown in FIG. 1*a*. The particle contains a light emitting core 102, a semiconductor shell 104, and organic ligands 106. Since the size of a typical quantum dot is on the order of a few nanometers and commensurate with that of its intrinsic exciton, both the absorption and emission peaks of the nanoparticle are blue shifted relative to that of their bulk values (R. Rossetti et al., J. Chem. Phys. 79, 1086 (1983)). As a result of the small size of the quantum dots, the surface electronic states of the dots have a large impact on the dot's fluorescence quantum yield. The electronic surface states of the light emitting core 102 can be passivated either by attaching appropriate organic ligands, such as primary aliphatic amines to its surface, or by epitaxially growing another semiconductor (the semiconductor shell 104) around the light emitting core 102. The advantages of growing the semiconductor shell 104 (relative to organically passivated cores) are that both the hole and electron core particle surface states can be simultaneously passivated, the resulting quantum yields are typically higher, and the quantum dots are more photostable and chemically robust.

Since the semiconductor shell 104 has a limited thickness (typically 1-3 monolayers), its electronic surface states also need to be passivated. Again, organic ligands 106 are the common choice. Taking the example of a CdSe/ZnS core/shell quantum dot, the valence and conduction band offsets at the core/shell interface are such that the resulting potentials act to confine both the holes and electrons to the core region. Since the electrons are typically lighter than the heavy holes, the holes are largely confined to the cores, while the electrons penetrate into the shell and sample the electronic surface states associated with the metal surface atoms (R. Xie et al., J. Am. Chem. Soc. 127, 7480 (2005)). Accordingly, for the case of CdSe/ZnS core/shell quantum dots, only the shell's electron surface states need to be passivated. An example of a suitable organic ligand 106 would be an aliphatic primary amine that forms a donor/acceptor bond to the surface Zn atoms (X. Peng et al., J. Am. Chem. Soc. 119, 7019 (1997). In summary, typical highly luminescent quantum dots have a core/shell structure (higher bandgap surrounding a lower band gap) and have non-conductive organic ligands 106 attached to the shell's surface.

Colloidal dispersions of highly luminescent core/shell quantum dots have been fabricated by many workers over the past decade (O. Masala and R. Seshadri, Annu. Rev. Mater. Res. 34, 41 (2004)). U.S. Pat. No. 6,322,901 also describes useful methods of preparing core/shell quantum dots. Typically the light emitting core 102 is composed of type IV, III-V, II-VI, or IV-VI semiconductive materials.

Type IV refers to a semiconductive material including an element selected from Group IVB of the periodic table, for example, Si. Type III-V refers to semiconductive materials including an element selected from Group IIIB in combination with an element selected from Group VB of the periodic table, for example, InAs. Likewise, type II-VI refers to semiconductive materials including an element selected from Group IIB in combination with an element selected from Group VIB of the periodic table, for example, CdTe, and type IV-VI materials includes Group IVB elements in combination with Group VIB elements, for example, PbSe.

For emission in the visible part of the spectrum, CdSe is a preferred core material since by varying the diameter (1.9 to 6.7 nm) of the CdSe core, the emission wavelength can be tuned from 465 to 640 nm. Another preferred material includes $Cd_xZn_{1-x}Se$ where x is between 0 and 1. However, as is well-known in the art, useful quantum dots that emit visible light can be fabricated from other material systems, such as, doped ZnS (A. A. Bol et al., Phys. Stat. Sol. B224, 291 (2001) or InP. The light emitting cores 102 can be made by chemical methods well known in the art. Typical synthetic routes include decomposition of molecular precursors at high temperatures in coordinating solvents, solvothermal methods (O. Masala and R. Seshadri, Annu. Rev. Mater. Res. 34, 41 (2004)) and arrested precipitation (R. Rossetti et al., J. Chem. Phys. 80, 4464 (1984).

The semiconductor shell 104 is typically composed of type IV, III-V, IV-VI, or II-VI semiconductive materials. In one desirable embodiment, the shell includes type II-VI semiconductive material, such as, CdS or ZnSe. In one suitable embodiment, the shell contains elements selected from the group consisting of Zn, S, and Se or combinations thereof. The shell semiconductor is typically chosen to be nearly lattice matched to the core material and have valence and conduction band levels such that the core holes and electrons are largely confined to the core region of the quantum dot. Preferred shell material for CdSe cores is $ZnSe_yS_{1-y}$, with y varying from 0.0 to about 0.5. Formation of the semiconductor shell 104 surrounding the light emitting core 102 is typically accomplished via the decomposition of molecular precursors at high temperatures in coordinating solvents, M. A. Hines et al., J. Phys. Chem. 100, 468 (1996)) or reverse micelle techniques (A. R. Kortan et al., J. Am. Chem. Soc. 112, 1327 (1990).

In one desirable embodiment, suitable core/shell quantum dots have a shell sufficiently thick so that the wave functions of the core's electrons and holes will not significantly extend to the surface of the core/shell quantum dot. That is, the wave function will not sample the surface states. For example, in the case of a ZnS shell, it can be calculated using well-known techniques (S. A. Ivanov et al., J. Phys. Chem. 108, 10625 (2004)) that the thickness of the ZnS shell should be at least 5 monolayers (ML) thick in order to negate the influence of the ZnS surface states. However, it is often difficult to grow thick shells, for example, more than 2 mL of ZnS, without the generation of lattice defects due to the mismatch between the lattices of the shell and core materials (D. V. Talapin et al., J. Phys. Chem. 108, 18826 (2004)).

To obtain a thick shell and to avoid lattice defects it may be desirable to grow an intermediate shell between the core and the outer shell. For example to avoid the lattice defects, an intermediate shell of ZnSe can be grown between the CdSe core and the ZnS outer shell. This approach was described by Talapin et al. (D. V. Talapin et al., J. Phys. Chem. B108, 18826 (2004)), wherein an 8 mL thick outer shell of ZnS was grown on a CdSe core, with an intermediate shell of ZnSe having a thickness of 1.5 mL. More sophisticated approaches can also be taken to minimize the lattice mismatch difference, for instance, smoothly varying the semiconductor content of the intermediate shell from CdSe to ZnS over the distance of a number of monolayers (R. Xie et al., J. Am. Chem. Soc. 127, 7480 (2005).

Additionally, if necessary, intermediate shells of appropriate semiconductor content are added to the quantum dot in order to avoid the generation of defects associated with thick semiconductor shells 104. Desirably, the thickness of the outer shell and any inner shells of the core/shell quantum dot are sufficiently thick so that neither free core electrons nor holes sample the outer shell's surface states.

As is well known in the art, two low cost means for forming quantum dot films is depositing the colloidal dispersion of core/shell quantum dots 100 by drop casting and spin casting. Common solvents for drop casting quantum dots are a 9:1 mixture of hexane:octane (C. B. Murray et al., Annu. Rev. Mater. Sci. 30, 545 (2000)). The organic ligands 106 need to be chosen such that the quantum dot particles are soluble in hexane. As such, organic ligands with hydrocarbon-based tails are good choices, such as, the alkylamines. Using well-known procedures in the art, the ligands coming from the growth procedure (TOPO, for example) can be exchanged for the organic ligand 106 of choice (C. B. Murray et al., Annu. Rev. Mater. Sci. 30, 545 (2000)). When spin casting a colloidal dispersion of quantum dots, the requirements of the solvent are that it easily spreads on the deposition surface and the solvents evaporate at a moderate rate during the spinning process. It was found that alcohol-based solvents are a good choice; for example, combining a low boiling point alcohol, such as, ethanol, with higher boiling point alcohols, such as, a butanol-hexanol mixture, results in good film formation. Correspondingly, ligand exchange can be used to attach an organic ligand (to the quantum dots) whose tail is soluble in polar solvents; pyridine is an example of a suitable ligand. The quantum dot films resulting from these two deposition processes are luminescent, but non-conductive. The films are resistive since non-conductive organic ligands separate the core/shell quantum dot 100 particles. The films are also resistive since as mobile charges propagate along the quantum dots, the mobile charges get trapped in the core regions due to the confining potential barrier of the semiconductor shell 104.

Figure 1B:
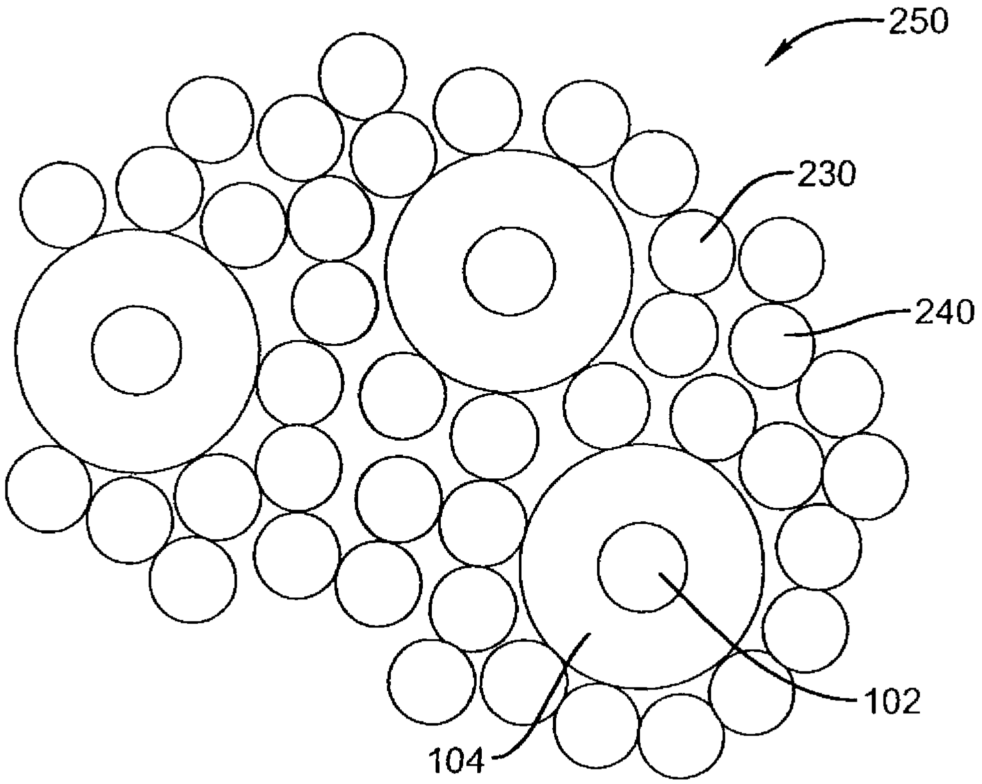
FIG. 1b Prior Art
FIG. 1*b* shows a schematic view of a section of a prior art inorganic light-emitting layer.

As discussed above, typical quantum dot films are luminescent, but insulating. FIG. 1*b* schematically illustrates a prior art way of providing an inorganic light-emitting layer 250 that is simultaneously luminescent and conductive. The concept is based on co-depositing small (<2 nm), conductive inorganic nanoparticles 240 along with the core/shell quantum dots 100 to form the inorganic light emitting layer 250. Subsequent inert gas (Ar or $N_2$) anneal steps are used to boil off the volatile organic ligands 106 and sinter the smaller inorganic nanoparticles 240 amongst themselves and onto the surface of the larger core/shell quantum dots 100. Sintering the inorganic nanoparticles 240 results in the creation of a continuous, conductive semiconductor matrix 230. Through the sintering process, this matrix is also connected to the core/shell quantum dots 100. As such, a conductive path is created from the edges of the inorganic light emitting layer 250, through the semiconductor matrix 230 and to each core/shell quantum dot 100, where electrons and holes recombine in the light emitting cores 102. It should also be noted that encasing the core/shell quantum dots 100 in the conductive semiconductor matrix 130 has the added benefit that it protects the quantum dots environmentally from the effects of both oxygen and moisture.

Making a light-emitting layer in this prior art method requires that a dispersion of semiconductor nanoparticle is formed separately from the dispersion of light-emitting quantum dots. The two dispersions are mixed to form a co-dispersion for coating a light-emitting layer. In one embodiment of the current invention the semiconductor nanoparticles are formed in a solution with the light-emitting quantum dots resulting in the formation of semiconductor nanocomposite particles. A useful semiconductor light-emitting nanocomposite particle includes a core/shell quantum dot connected to one or more semiconductor nanoparticles, wherein the connected nanoparticle(s) projects from the surface of the quantum dot. The projection may have various shapes including, for example, those resembling rods, wires, and spheres.

One inventive method for forming a colloidal dispersion of light-emitting nanocomposite particles includes combining a solvent for semiconductor nanoparticle growth, a solution of core/shell quantum dots, and semiconductor nanoparticle precursor(s) to form a mixture. Growth of the nanoparticles results in the formation of nanocomposite particles. For example, in one embodiment the nanoparticle precursors may react to form nanoparticle nuclei, which are small crystals of semiconductor material. Growth of the nanoparticle nuclei, in the presence of core/shell quantum dots, results in the formation of a mixture containing light-emitting nanocomposite particles. The mixture typically also includes free nanoparticles, which are not attached to quantum dots; the mixture may also include unaltered quantum dots as well as nanoparticle nuclei and aggregates of nanoparticle nuclei.

Preferred core/shell quantum dots include a core (for example, CdSe), surrounded by a shell of a second composition (for example, ZnS). Non-limiting examples of useful core/shell pairs include: CdSe/ZnS, CdSe/CdS, CdZnSe/ZnSeS, and InAs/CdSe quantum dots.

Suitable nanoparticle precursors are those that will form nanoparticles composed of semiconductive material including type IV, III-V, IV-VI, or II-VI materials. In one desirable embodiment, nanoparticles contain type IV (for example, Si), III-V (for example, GaP), II-VI (for example, ZnS or ZnSe) or IV-VI (for example, PbS) semiconductors. Type IV, III-V, II-VI, and IV-VI materials have been described previously. In one desirable embodiment, the semiconductor nanoparticle includes ZnS or ZnSe, or mixtures thereof.

In a preferred embodiment, the inorganic semiconductor nanoparticles include a semiconductor material with a band gap comparable to that of the semiconductor shell 104 of the core/shell quantum dot, more specifically a band gap within 0.2 eV of the band gap of the shell of the quantum dot. For example, if the outer shell of the core/shell quantum dot 104 includes ZnS, then an example of desirable inorganic nanoparticle includes ZnS or materials composed of ZnSSe with a low Se content.

Methods of growing semiconductor nanoparticles are well-known in the art. A useful method includes that reported by Khosravi et al. (A. A. Khosravi et al., Appl. Phys. Lett. 67, 2506 (1995)). By way of example, a nanoparticle nucleus composed of elements XY can be formed by combining a precursor that is an X donor and a precursor that is a Y donor in a solvent. For example, a nanoparticle nucleus composed of ZnS (X=Zn and Y=S) can be formed by combining a Zn donor, for example, $ZnCl_2$, and a S donor, for example, bis(trimethlysilyl)sulfide $(TMS)_2S$. In the presence of excess precursors, and under the proper reaction conditions, the nanoparticle nucleus is formed and will grow into a nanoparticle.

Especially useful X donors include materials that donate IV, IIB, IIIB, or IVB elements. Non-limiting examples include diethylzinc, zinc acetate, cadmium acetate, and cadmium oxide.

Especially useful Y donors include ones that donate a group VB element or a group VIB element. Non-limiting examples of useful Y donors include trialkylphosphine selenides such as (tri-n-octylphosphine) selenide (TOPSe) or (tri-n-butylphosphine) selenide (TBPSe); trialkylphosphine tellurides such as (tri-n-octylphosphine) telluride (TOPTe) or hexapropylphosphorustriamide telluride (HPPTTe); bis(trimethylsilyl)telluride ($(TMS)_2Te$), bis(trimethylsilyl)sulfide ($(TMS)_2S$); bis(trimethylsilyl)selenide ($(TMS)_2Se$); and trialkylphosphine sulfides such as (tri-n-octylphosphine) sulfide (TOPS).

In certain embodiments, the X donor and the Y donor can be moieties within the same molecule. For example, hexadecylzinc xanthate contains both the Zn and S precursors for forming ZnS. In some embodiments there may be more than two nanoparticle precursors. In further embodiments, the nanoparticle nucleus may contain one, two, or more than two elements.

In some embodiments it may be useful to form nanocomposite particles that include dopants. Dopants are generally small amounts of a compound, which can be incorporated into a material to improve its conductivity performance. This can often be accomplished by adding one or more dopant precursors either to the initial reaction mixture or during the nanoparticle growth process. The dopant is generally an element that becomes incorporated into the lattice structure of the nanoparticle portion of the nanocomposite particle. For example, if it is desirable to grow nanocomposites containing ZnSe doped with Al, one could grow ZnSe nanoparticles in the presence of quantum dots and in the presence of a small amount of Al precursor. For instance, one could combine the quantum dots; a Zn donor such as diethylzinc in hexane; a Se donor such as Se powder dissolved in TOP, which forms TOPSe; a small amount of an Al donor, such as, trimethylaluminum; and a coordinating solvent, such as, hexadecylamine (HDA). This provides an in situ doping process.

During the growth process it is often desirable to have a coordinating solvent present. A coordinating solvent can reversibly coordinate to the surface of the growing nanoparticles in order to better control the growth process and to stabilize the resulting colloid. The solvent may act as a coordinating ligand or a coordinating ligand may be used in combination with a non-coordinating solvent. Desirable coordinating ligands have one or more pairs of unshared electrons that they can donate to the surface of the growing nanoparticle. Examples of useful coordinating ligands include phosphines, for example tri-n-octyl phosphine (TOP); phosphine oxides, for example tri-n-octyl phosphine oxide (TOPO); phosphonic acids, for example, tetradecylphosphonic acid; and aliphatic thiols. Amines are especially useful as coordinating ligands. In particular, aliphatic primary amines such as hexadecylamine or octylamine or combinations of aliphatic primary amines are valuable.

The growth process can be controlled by various means, for example, by controlling the temperature of the reaction mixture, by controlling the concentration and types of precursors, by the choice of solvents, and by the choice and concentration of coordinating ligands. In one preferred embodiment it is desirable to heat the reaction mixture to promote the growth process. It may be useful to subject the reaction mixture to microwave radiation or to carry out the reaction under pressure or a combination thereof with or without heating.

In a preferred embodiment, the rates of addition of precursors, as well as the temperature of the reaction mixture, are factors used to optimize nanoparticle formation and growth. In one suitable embodiment, two or more nanoparticle precursors are combined rapidly, for example by injecting or adding rapidly all of the precursors in the presence of a solvent and one or more coordinating ligands. In one suitable embodiment, the solvent is an aliphatic primary amine. In a preferred embodiment, a coordinating solvent is mixed with one of the precursors and the reaction mixture is heated to a reaction temperature and a second precursor is injected or added rapidly to the mixture.

Typical reaction temperatures are often greater than 80° C., frequently equal to or greater than 100° C. and may be 120° C. or even higher. Preferably the solvent is heated to a reaction temperature between 100° C. and 300° C.

The precise nature of the reaction conditions necessary for good nanoparticle growth will vary depending on the composition of the nanoparticle and its precursors. Reaction conditions can be determined by one skilled in the art without undue experimentation.

It is typically useful to carry out the growth process in the absence of substantial amounts of oxygen and under inert conditions. This can often prevent the formation of undesirable metal oxides. For example, the reaction may be conducted under an atmosphere of nitrogen or argon.

Desirably the growth process is continued until the majority of quantum dots are converted into nanocomposite particles. A method for monitoring the growth process includes removing an aliquot sample from the reaction mixture and subjecting the sample to centrifugation to form a precipitate and a supernatant liquid that may contain quantum dots. The supernatant is exposed to a light source wherein the wavelength of light is chosen such that, when absorbed by a quantum dot, photoluminescence will occur. By careful calibration, one can determine from the photoluminescence the concentration of quantum dots in the supernatant. In one embodiment, the growth process is continued until the concentration of quantum dots in the supernatant is below 20% and preferably below 10% of the initial quantum dot concentration.

Figure 2:
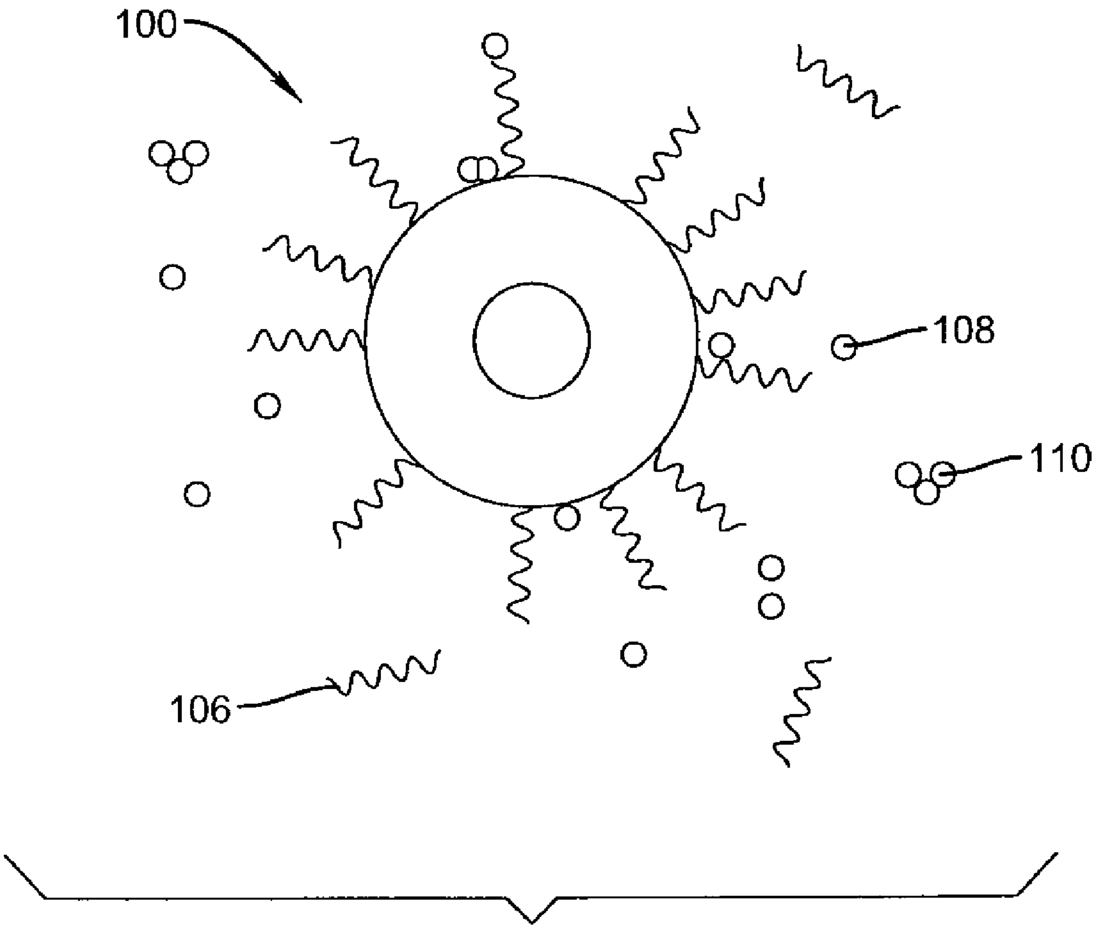
FIG. 2 shows a schematic view of a colloidal dispersion including core/shell quantum dots and nanoparticle nuclei.
Figure 3:
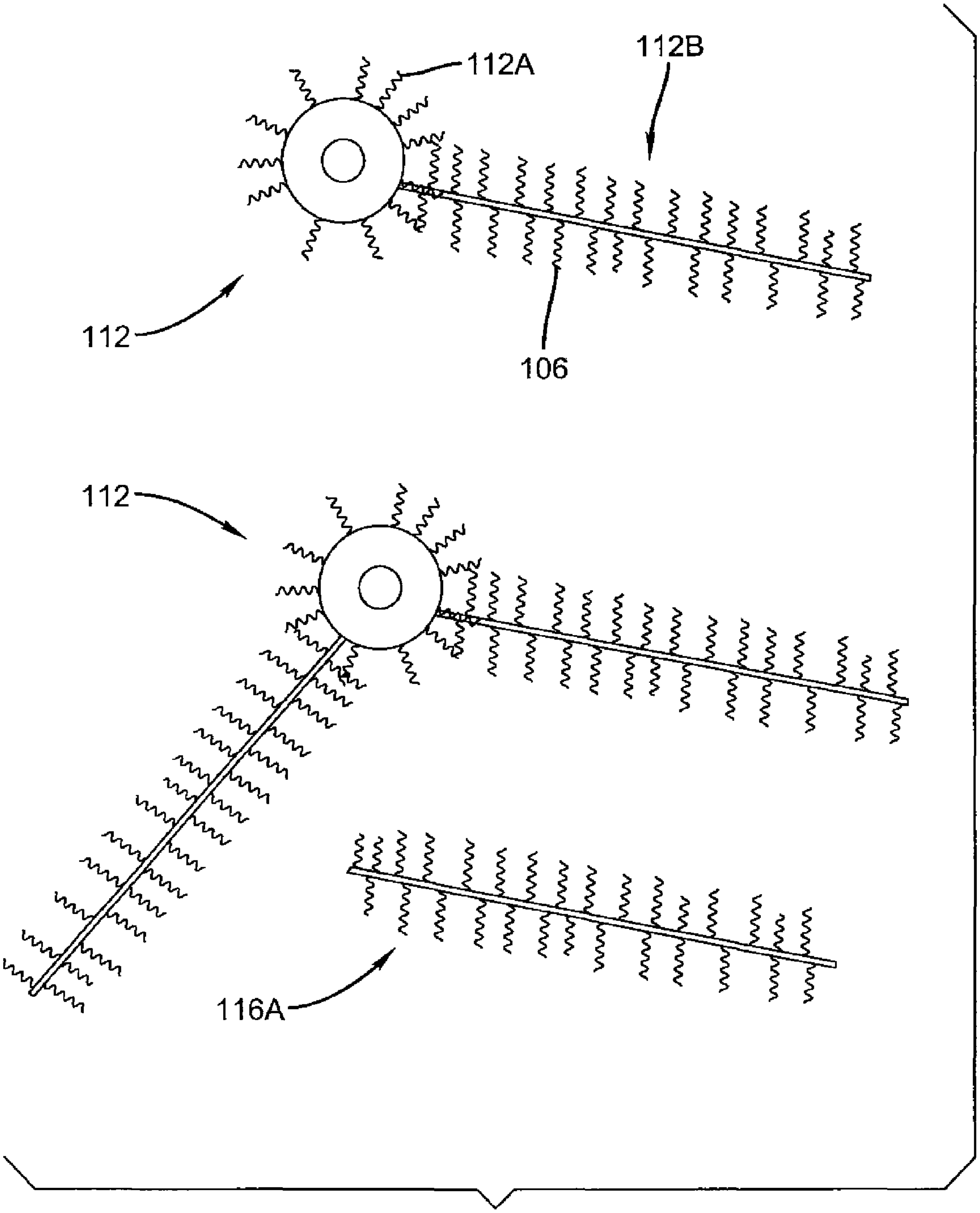
FIG. 3 shows a schematic view of nanocomposite particles and a nanowire.

FIG. 2 shows a schematic representation of one embodiment of a reaction mixture, including core/shell quantum dots 100, semiconductor nuclei 108, and coordinating ligands 106. During the growth process one or more nuclei will become attached to the surface of a quantum dot; this nuclei can grow outwards from the surface of the quantum dot to form a light-emitting nanocomposite particle 112. Such a nanocomposite particle 112 is depicted schematically in FIG. 3, and includes a quantum dot portion 112A and a nanoparticle portion 112B. Coordinating ligands 106 bind to and stabilize the surfaces of both portions of the nanocomposite particle 112. Some nanocomposite particles 112 contain a quantum dot connected to more than one nanoparticle. During the growth process it is anticipated that free nanoparticles 116A, which are not attached to quantum dots, will also form and will have ligands associated with their surfaces.

Figure 4:
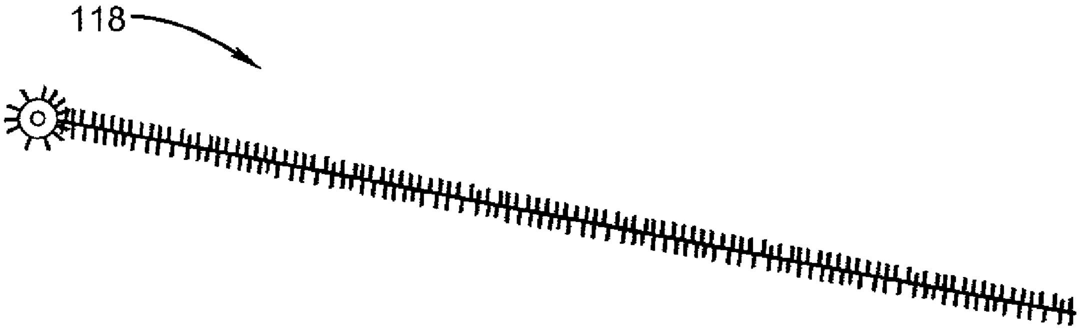
FIG. 4 shows a schematic view of another nanocomposite particle.

The nanocomposite particle 112 includes a nanoparticle projecting from the outer shell of a core/shell quantum dot. As described previously, the projection may have various shapes including those resembling rods, wires, and spheres depending on the reactants and the growing conditions. In a preferred embodiment, the projection resembles a nanowire. By extending the growth process, nanocomposites with long wire-projections 118 can be obtained as shown schematically in FIG. 4. For example, the length of the nanowire projection may be 20 nm, 50 nm, 100 nm, 500 nm, or even 1000 nm (1 micron) or greater, while the quantum dots typically have a diameter of less than 8 nm. In order to confer good sintering properties, it is preferable that the average diameter of the nanoparticle connected to the quantum dot is less than 20 nm, desirably less than 10 nm, and preferably less than 5 nm. A nanowire portion of a nanocomposite particle can also be characterized in terms of its aspect ratio, which is the length of the nanoparticle divided by its diameter. Especially desirable nanowire projections have an aspect ratio of greater than 10, suitably greater than 30, and preferably greater than 100, or even greater than 500.

The preparation of nanoparticles of various shapes is well known in the art. For instance, the preparation of nanowires is described by Pradhan et al. (N. Pradhan et al., Nano Letters 6, 720 (2006)). Alivisatos et al., U.S. Pat. No. 6,306,736 and U.S. Pat. No. 6,225,198, also describe a process for forming shaped group III-V and group II-VI semiconductor nanoparticles by combining semiconductor nanoparticle precursors, a solvent, and a binary mixture of phosphorus-containing organic surfactants, such as, a mixture of phosphonic acid and phosphonic acid derivatives, that are capable of promoting the growth of either spherical semiconductor nanoparticles or rod-like semiconductor nanoparticles. The shape of the nanoparticle is controlled by adjusting the ratio of the surfactants in the binary mixture.

As described previously, preferably the outer surface of the nanocomposite particles will include a layer of coordinating ligands 106 used during the growth process. It is often desirable to change the ligands associated with the nanocomposite both to improve the solubility of the nanocomposite in a coating solvent and to facilitate ligand removal during the annealing step. Useful methods for ligand exchange include those described by Murray et al. (C. B. Murray et al., Annu. Rev. Mater. Sci. 30, 545 (2000)); and by Schulz et al., (Schulz et al., U.S. Pat. No. 6,126,740). For example, ligand exchange can be used to attach an organic ligand to the nanocomposite whose tail is soluble in polar solvents and which is relatively volatile; pyridine is an example of a suitable ligand.

A colloidal dispersion containing light-emitting nanocomposites, can also contain free nanoparticles or free quantum dots. In some embodiments, it may be desirable to combine this dispersion with a second dispersion containing additional nanoparticles, which may be the same or different than the free nanoparticles, in a manner similar to that described by Kahen in U.S. Patent Application Publication No. 2007/0057263. In some embodiments it may be desirable to add additional quantum dots to the colloidal dispersion.

The colloidal dispersion may be coated on a substrate to form a light-emitting layer. Two low cost means for forming films from a colloidal dispersion of particles include drop casting and spin casting. Non-polar, volatile solvents are often used for coating. For example, a common solvent for drop casting that is useful for depositing quantum dots is a 9:1 mixture of hexane:octane (C. B. Murray et al., Annu. Rev. Mater. Sci. 30, 545 (2000)). In one embodiment, the exchanged ligands of the nanocomposite are chosen so that the nanocomposite is soluble in non-polar solvents such as hexane. As such, organic ligands with hydrocarbon-based tails are good choices, such as, for example, aliphatic amines.

Desirable solvents for spin casting a colloidal dispersion include those that spread easily on the deposition surface and evaporate at a moderate rate during the spinning process. Useful solvents include alcohol-based solvents, and in particular, mixtures of a low-boiling alcohol and a higher-boiling alcohol. For example, using a coating solvent formed from a combination of ethanol with mixture of butanol and hexanol, results in good film formation after spin casting.

Figure 5:
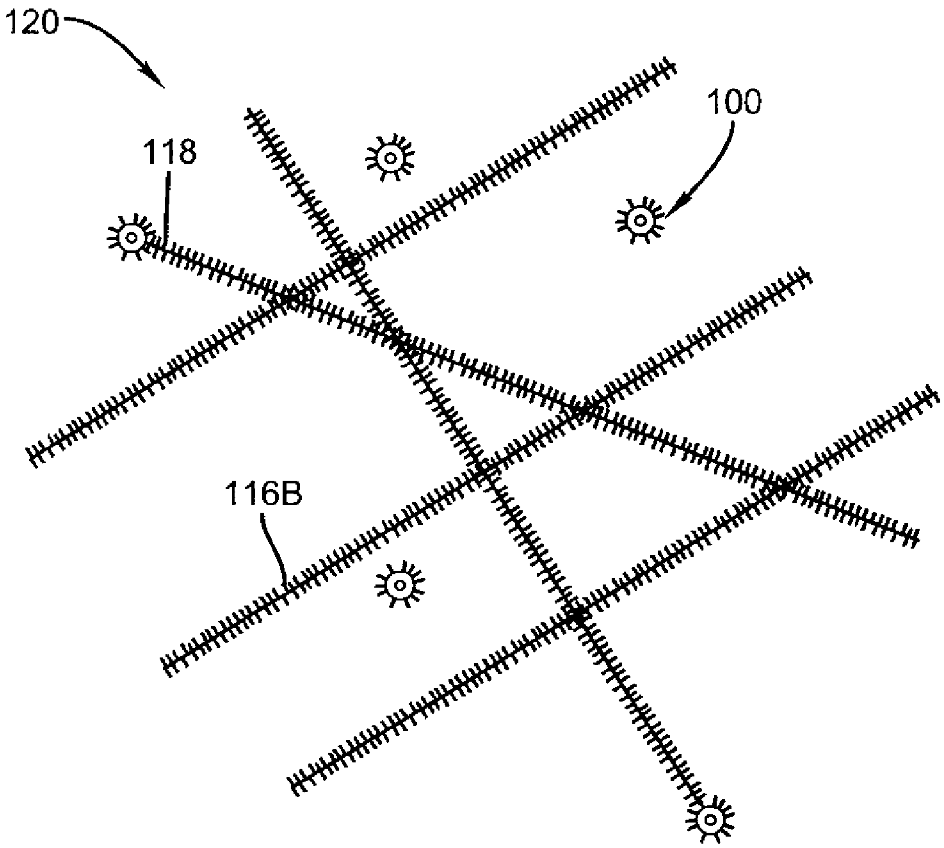
FIG. 5 shows a schematic view of an inorganic light-emitting layer.

Films containing nanocomposite particles can be formed by the spin-casting process, however, the resulting films as-coated are luminescent, but non-conductive. The films are resistive since non-conductive organic ligands separate the nanocomposite particles form each other and from free nanoparticles. FIG. 5 shows a schematic view of one embodiment of a light-emitting layer 120 formed from a colloidal dispersion of nanocomposite particles 118, nanoparticles (nanowires) 116B, and core/shell quantum dots 100. To remove the insulating ligands and to form a conductive light-emitting layer, an annealing step is required, usually performed under inert atmosphere (for example, under nitrogen or argon). Annealing the coated colloidal dispersion sinters the nanocomposite particles 118 amongst themselves and with free nanoparticles 116B, to form a semiconductor matrix. Additionally, if there are free core/shell quantum dots, the anneal step can connect these quantum dots to the semiconductor matrix.

As noted above, sintering produces a polycrystalline conductive semiconductor matrix. As such, conductive paths are created from the edges of the inorganic light emitting layer, through the semiconductor matrix and to the core/shell quantum dots located within the matrix. Electrons and holes are transported within the matrix and can recombine in the core of a quantum dot resulting in light emission. Fusing the light-emitting nanocomposites into the conductive semiconductor matrix has the added benefit of protecting the quantum dots in the light emitting layer from the effects of environmental oxygen and moisture.

As is well known in the art, nanometer-sized nanoparticles melt at much reduced temperature relative to their bulk counterparts (A. N. Goldstein et al., Science 256, 1425 (1992)). Consequently, in one embodiment, in order to enhance the sintering process, it is desirable that the nanoparticles attached to the quantum dots and any free nanoparticles present, have diameters of less 20 nm, suitably less than 10 nm, desirably less than 5 nm, preferably less than 2 nm, and more preferably less than 1.5 nm. Additionally for good conductivity in the final layer it is desirable that a majority of the nanocomposite particles in the colloidal dispersion have a surface area ratio of the nanoparticle-portion to that of the quantum dot-portion of 1:1 or greater, desirably 2:1 or greater, and preferably 3:1 or greater.

The sintering temperature can be chosen to cause at least partial melting of the nanoparticle portion of the nanocomposite without substantially affecting the shape and size of the quantum dot portion. For example, certain core/shell quantum dots with ZnS shells, have been reported to be relatively stable for anneal temperatures up to 350° C. (S. B. Qadri et al., Phys. Rev B60, 9191 (1999)). Thus, in one embodiment, the anneal temperature is less than 350° C. Preferably the growth process is controlled so that the diameter of the nanoparticle portion is less than that of the quantum dot portion of the nanocomposite and consequently will have a lower melting point. Desirably, the nanoparticle portion of the nanocomposite at least partially melts at a temperature below 350° C., desirably below 250° C., and preferably below 200° C.

The annealing process is carried out for a sufficient time to ensure good conductivity is obtained in the resulting film. In one embodiment, a useful annealing step includes heating at a temperature of 250° C. to 300° C. for up to 60 minutes.

As described previously, it is often desirable to subject the nanocomposites to a ligand exchange procedure in order to increase their solubility in coating solvents. It is also desirable to choose ligands that are sufficiently volatile so that they can be substantially removed during the annealing process. Volatile ligands are ligands that have a boiling point below 200° C., desirably, below 175° C., and preferably below 150° C. If the ligands are not volatile, and cannot be removed, they may decompose during sintering. The ligands or their decomposition products may interfere with film conductivity by acting as insulators. In order to enhance the conductivity (and electron-hole injection process) of the inorganic light emitting layer, it is preferred that the organic ligands 106 attached to the nanocomposite evaporate as a result of annealing the inorganic light-emitting layer 120 in an inert atmosphere. By choosing the organic ligands 106 to have a low boiling point, they can be made to evaporate from the film during the annealing process (C. B. Murray et al., Annu. Rev. Mater. Sci. 30, 545 (2000)).

It may be desirable to perform the annealing step in two or more stages. In one embodiment, the annealing process includes two annealing steps; a first annealing removes volatile ligands and a second annealing creates the semiconductor matrix. For example, a first annealing step may be carried out at temperatures between 120° C. and 220° C. for a time up to 60 minutes and a second annealing step conducted at temperatures between 250° C. and 400° C. for a time up to 60 minutes.

Annealing thin films at elevated temperatures can result in cracking of the films due to thermal expansion mismatches between the film and the substrate. To avoid this problem, it is preferred that the anneal temperature be ramped from room temperature to the anneal temperature and from the anneal temperature back down to room temperature. A preferred ramp time is on the order of 30 minutes.

Following the anneal step, the core/shell quantum dots embedded in the semiconductor matrix are substantially devoid of an outer shell of organic ligands. As described previously, it is desirable that the core/shell quantum dots have a shell thickness sufficiently large that the wave functions of electrons or holes in the core region do not sample the shell's surface states.

Figure 6:
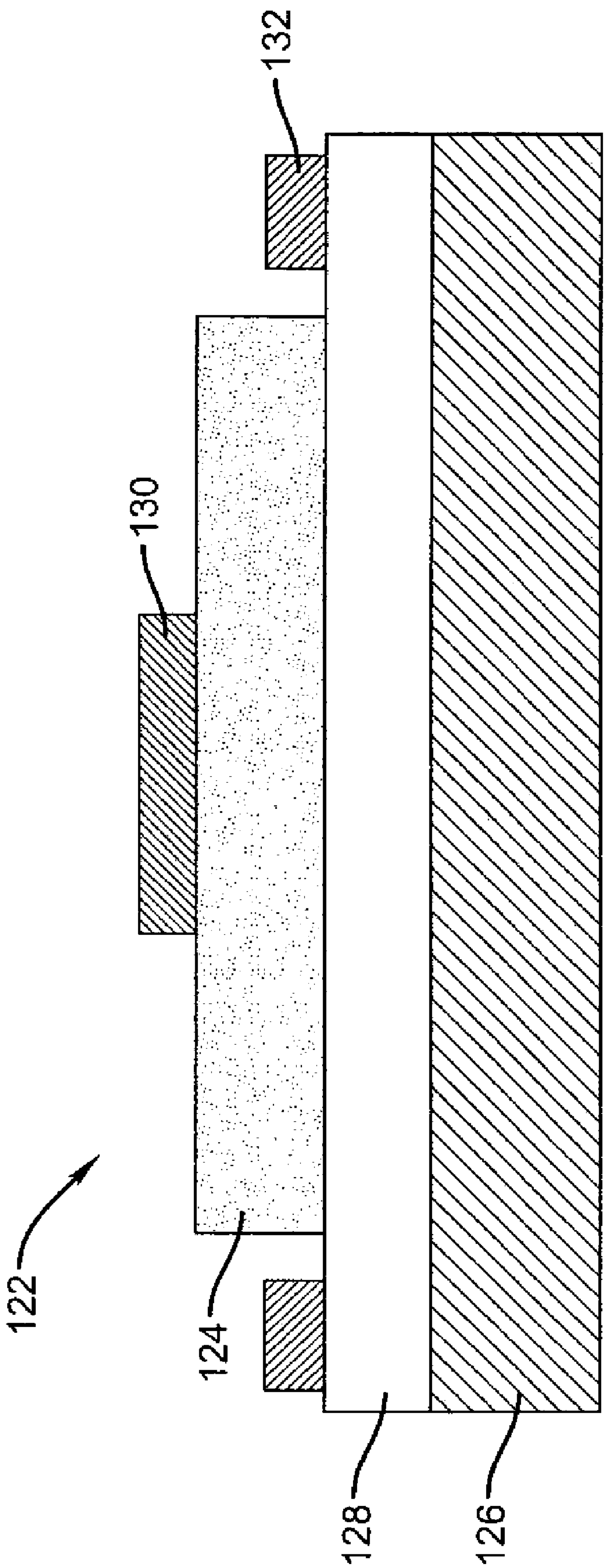
FIG. 6 shows a side-view schematic of an inorganic light emitting device in accordance with the present invention.

FIG. 6 shows a schematic of a simple electroluminescent LED device 122 that incorporates an inorganic light-emitting layer 124, formed by annealing layer 120 deposited on a substrate 126. The thickness of the inorganic light-emitting layer 124 should be sufficient to afford good light emission. In one embodiment, the film thickness is 10 nm or greater and preferably between 10 and 100 nm.

Preferably, the substrate 126 is chosen so that it is sufficiently rigid to enable the deposition processes and sufficiently thermally stable to withstand the annealing processes. For some applications, it may be desirable to use a transparent support. Examples of useful substrate materials include glass, silicon, metal foils, and some plastics.

An anode 128 is deposited onto the substrate 126. For the case where the substrate 126 is p-type Si, the anode 128 needs to be deposited on the bottom surface of the substrate 126. A suitable anode metal for p-Si is Al. The anode 128 can be deposited by well-known methods such as by thermal evaporation or sputtering. Following its deposition, it is often desirable to anneal the anode 128. For example in the case of an Al anode, annealing at 430° C. for 20 minutes is suitable.

For many substrate types that do not include p-type Si material, the anode 128 can be deposited on the top surface of the substrate 126 (as shown in FIG. 6). Desirably, the anode 128 includes a transparent conductor, such as indium tin oxide (ITO). The ITO can be deposited by sputtering or other well-known procedures in the art. The ITO is typically annealed at 300° C. for 1 hour to improve its transparency. Because the sheet resistance of transparent conductors such as ITO is much greater than that of metals, bus metal 132 can be selectively deposited through a shadow mask using thermal evaporation or sputtering to lower the voltage drop from the contact pads to the actual device. The inorganic light-emitting layer 120 can be deposited on the anode 128. As discussed previously, the light-emitting layer can be drop or spin casted onto the transparent conductor (or Si substrate). Other deposition techniques, such as, inkjetting the colloidal quantum dot-inorganic nanoparticle mixture, are also possible. Following the deposition, the inorganic light-emitting layer 120 is annealed, for example, at temperature of 270° C. for 45 minutes, to form the light-emitting layer 124.

Lastly, a cathode 130 metal can be deposited over the inorganic light emitting layer 124. Suitable cathode metals are ones that form an ohmic contact with the light-emitting layer and the semiconductor matrix. For example, for the case of nanocomposites containing core/shell quantum dots with ZnS shells, a preferred cathode metal is In. It can be deposited by thermal evaporation, followed by a thermal anneal, for example, at about 250° C. for 10 minutes. In some embodiments, the layer structure can be inverted, such that the cathode 130 is deposited on the substrate 126 and the anode 128 can be formed on the inorganic light-emitting layer 124.

Figure 7:
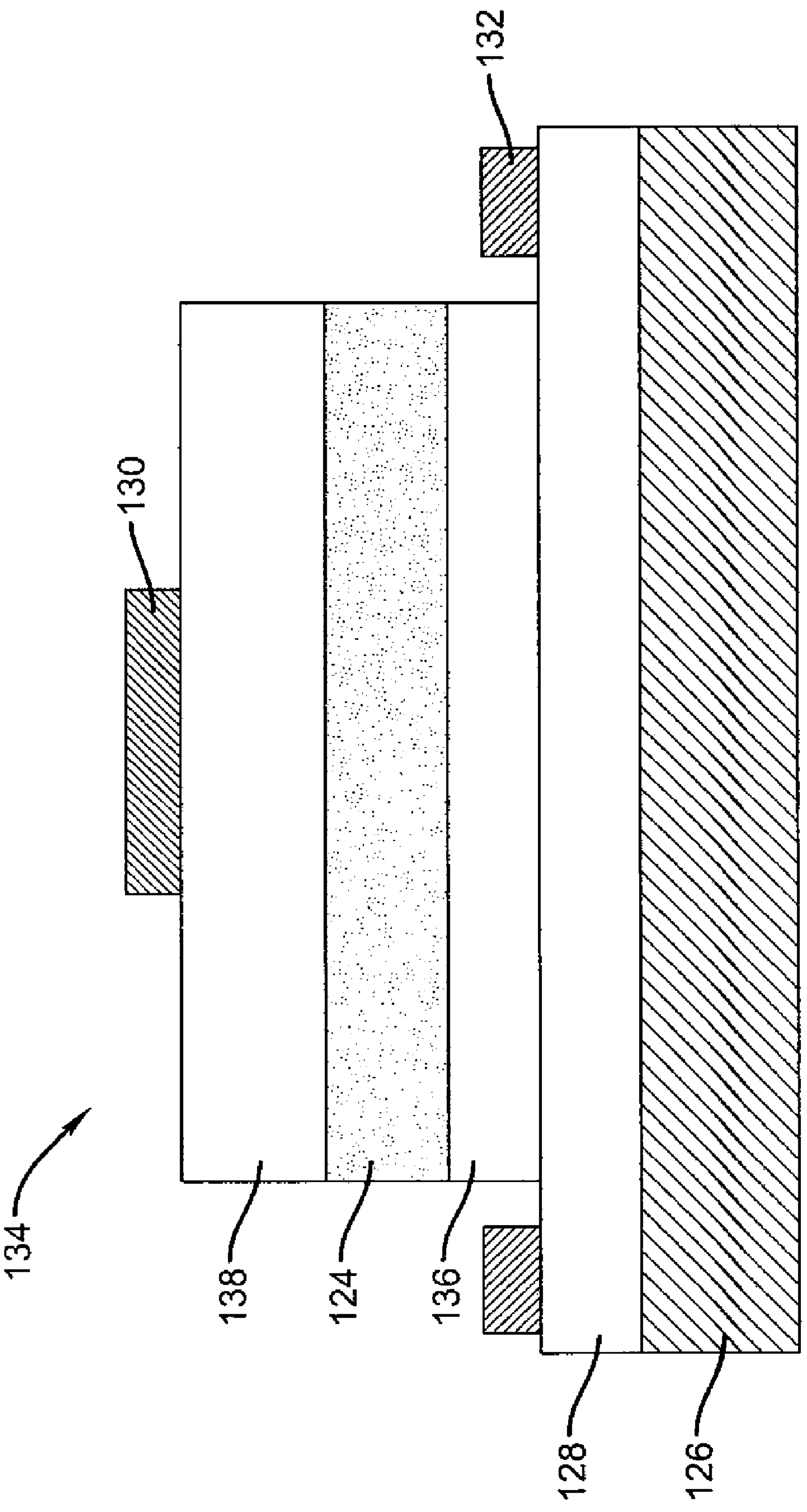
FIG. 7 shows a side-view schematic of another embodiment of an inorganic light emitting device in accordance with the present invention.

FIG. 7 provides a schematic representation of another embodiment of an electroluminescent LED device 134 that incorporates the inorganic light-emitting layer 124. The figure shows that a p-type transport layer 136 and an n-type transport layer 138 are added to the device and surround the inorganic light-emitting layer 124. As is well known in the art, LED structures typically contain doped n- and p-type transport layers. They serve a number of different purposes. Forming ohmic contacts to semiconductors is simpler if the semiconductors are doped. Since the emitter layer is typically intrinsic or lightly doped, it is much simpler to make ohmic contacts to the doped transport layers. As a result of surface plasmon effects (K. B. Kahen, Appl. Phys. Lett. 78, 1649 (2001)), having metal layers adjacent to emitter layers results in a loss emitter efficiency. Consequently, it is often advantageous to space the emitters layers from the metal contacts by sufficiently thick (preferably, at least about 150 nm) transport layers. Not only do the transport layers inject electrons and holes into the emitter layer, but, by proper choice of materials, they can prevent the leakage of the carriers out of the emitter layer. For example, if the inorganic nanoparticle portion 112B of the nanocomposite 112 and the free nanoparticles 116 were composed of $ZnS_{0.5}Se_{0.5}$ and the transport layers were composed of ZnS, then the electrons and holes would be confined to the emitter layer by the ZnS potential barrier. Suitable materials for the p-type transport layer include II-VI and III-V semiconductors. Typical II-VI semiconductors are ZnSe, CdS, and ZnS. To get sufficiently high p-type conductivity, additional p-type dopants should be added to all three materials. For the case of II-VI p-type transport layers, possible candidate dopants are lithium and nitrogen. For example, it has been shown in the literature that $Li_3N$ can be diffused into ZnSe at 350° C. to create p-type ZnSe, with resistivities as low as 0.4 ohm-cm (S. W. Lim, Appl. Phys. Lett. 65, 2437 (1994), the entire disclosure of which is incorporated herein by reference).

Suitable materials for the n-type transport layer include II-VI and III-V semiconductors. Typical II-VI semiconductors are preferably ZnSe or ZnS. As for the p-type transport layers, to get sufficiently high n-type conductivity, additional n-type dopants should be added to the semiconductors. For the case of II-VI n-type transport layers, possible candidate dopants are the Type III dopants of Al, In, or Ga.

Suitable electroluminescent devices may include various device structures. Devices containing the light-emitting layer and a substrate, may include the anode formed on the substrate, the cathode formed on the substrate, or both formed on the substrate.

In a preferred embodiment, polycrystalline nanoparticle based semiconductor transport layers are formed according to methods described in above-cited, commonly assigned U.S. patent application Ser. No. 11/668,041; U.S. patent application Ser. No. 11/677,794; and U.S. patent application Ser. No. 11/678,734, the disclosures of which are incorporated herein.

In one embodiment, nanoparticle based transport layers, which may be doped, and doped semiconductor junctions in the light-emitting device are formed from semiconductor nanoparticles, which may be the same or different than the free nanoparticles described previously. Nanoparticles with dopants are doped either by in-situ or ex-situ processes. For the in-situ doping procedure, dopant materials are added during the process of synthetic growth of the colloidal nanoparticles. For the ex-situ doping procedure, a device layer is formed by coating on a surface a mixture of semiconductor and dopant material nanoparticles, wherein an anneal is performed to fuse the semiconductor nanoparticles and to enable dopant material atoms to diffuse out from the dopant material nanoparticles and into the fused semiconductor nanoparticle network.

Semiconductor junctions composed of inorganic nanoparticles are typically highly resistive, which limits the usefulness of devices incorporating these junctions despite their low cost. By forming doped semiconductor junctions incorporating either in-situ or ex-situ doped inorganic nanoparticles, one can produce semiconductor junction devices at low cost while still maintaining good device performance. Doped semiconductor junctions help device performance by increasing the separation of the n- and p-Fermi levels in the respective transport layers, reducing ohmic heating, and aiding in forming ohmic contacts.

In a preferred embodiment, a light-emitting device includes at least one nanoparticle-based transport layer, that is, at least n-type or p-type layer, that is formed by annealing a mixture of semiconductor nanoparticles. In one embodiment, the nanoparticles include nanowires having an average diameter of less than 10 nm and preferably less than 5 nm, and an aspect ratio of 10 or greater, and desirably 100 or greater. Suitable annealing conditions have been described previously.

By forming transport layers and doped semiconductor junctions from inorganic nanoparticles, the device layers can be deposited by low cost processes, such as, drop casting, spin coating, or inkjetting. The resulting nanoparticle-based device can also be formed on a range of substrates, including flexible ones.

The following examples are presented as further understandings of the present invention and are not to be construed as limitations thereon.

EXAMPLE 1

Preparation of Light-Emitting Nanocomposite Particles and Formation of a Light-Emitting Layer Preparation of Quantum Dots CdSe/ZnSeS core shell quantum dots were prepared by the following procedure. Standard Schlenk line procedures were followed for the synthesis. CdSe cores were formed following the green synthesis procedure of Talapin et al. (D. V. Talapin et al., J. Phys. Chem. B108, 18826 (2004)). More specifically, 532 nm emitting CdSe cores were obtained after vigorously stirring the reaction mixture at 260° C. for 7.5 minutes. After cooling the CdSe crude solution back to room temperature, 4 ml of TOPO and 3 ml of HDA were added to 1.5 ml of crude solution (unwashed) in a Schlenk tube. After degassing the mixture at 110° C. for 30 minutes, the solution was brought up to 190° C. under argon overpressure and constant stirring. With the shell composed of ZnSeS, precursors of Zn, Se, and S were prepared in a dry box. The Zn precursor was 1 M diethylzinc in hexane, the Se precursor was 1 M TOPSe (prepared by standard methodologies) and the S precursor was 1 M $(TMS)_2S$ in TOP. In a syringe was added 200 μmol of the Zn precursor, 100 μmol of the Se precursor, and 100 μmol of the S precursor (to form $ZnSe_{0.5}S_{0.5}$). An additional 1 ml of TOP was also added to the syringe. The contents of the syringe were then dripped into the Schlenk tube at a rate of 10 ml/hr. After dripping in the contents of the syringe, the core/shell quantum dots were annealed at 180° C. for 1 hour. The emission wavelength was unchanged by the shelling procedure.

Preparation of Light-Emitting Nanocomposite Particles

ZnSe quantum wires were formed in the presence of quantum dots. The wires were synthesized by a procedure analogous to that described by Pradhan et al. (N. Pradhan et al., Nano Letters 6, 720 (2006)), using a zinc precursor of zinc acetate and a Se precursor of selenourea. Equal molar ($1.27\times10^{-4}$ moles) amounts of the precursors were used in the synthesis. The coordinating solvent was octylamine (OA) that was degassed at 30° C. for 30 minutes prior to use.

In a small vial inside of a dry box, 0.03 g of zinc acetate was added to 4 ml OA to form a cloudy solution. After gently heating and with constant mixing, the solution became clear in 5-10 minutes. This mixture was placed in a three-neck flask and connected to a Schlenk line. 2.0 ml of the core/shell quantum dot crude (unwashed) solution, synthesized as described above, was added to the solution. At room temperature the contents were subjected to three cycles of gas evacuation, followed by argon refilling. After the third cycle, the reaction mixture was heated to 120° C.

The Se precursor was prepared by adding (in a dry box) 0.016 g of selenourea to 550 μl of OA in a small vial. The mixture became clear after gentle heating and continuous stirring for 25-30 minutes. The solution was transferred to a syringe and injected into the reaction mixture, which was at a temperature of 120° C. The reaction mixture turned cloudy within seconds of the injection. With slow stirring, the growth of ZnSe nanowires in the presence of quantum dots was continued for 4-6 hours at 120° C., followed by a final 20 minute heating at 140° C. This afforded a product mixture containing nanocomposite particles and nanowires.

About 1-2 ml of the crude product mixture was added to 3 ml of toluene and 10 ml of methanol in a centrifuge tube. After centrifuging for several minutes, a precipitate formed and the supernatant was clear and did not emit light when exposed to UV light. The supernatant was decanted off and 3-4 ml of pyridine was added. The precipitate dissolved in the pyridine to afford a clear solution.

The pyridine solution, containing nanocomposite particles and nanowires, was heated at 80° C. under continuous stirring for 24 hours in order to exchange the nonvolatile OA ligands for volatile pyridine ligands. Some of the excess pyridine was then removed by vacuum prior to adding approximately 12 ml of hexane to the solution. This solution was then centrifuged, the supernatant decanted, and a mixture of 1-propanol and ethanol was added to the precipitate plug in order to get a clear dispersion.

Formation of a Light-Emitting Layer

Specular nanoparticle-based films were obtained upon spin coating aliquots of the dispersion on clean borosilicate glass. The films were spin coated in the dry box. The films were then annealed in a tube furnace (with flowing argon) at 160° C. for 30 minutes, followed by 275° C. for 30 minutes in order to boil off the pyridine ligands and to sinter the nanocomposite particles and nanowires. The second annealing step formed a semiconductor matrix. The resulting annealed light emitting layer produced highly visible photoluminescence (viewed in bright room lights) upon exposure to 365 nm UV light.

EXAMPLE 2

Comparative Separation of Quantum Dots from a Solvent

A crude solution containing only core/shell quantum dots (the same ones used in Example 1), having nonvolatile TOPO, HDA, and TOP ligands, was ligand exchanged (exchange to pyridine ligand) in substantially the same manner as described in the first section of Example 1. No substantial problems were encountered in the first washing (with toluene and methanol). As such, a plug could be formed following centrifuging and the resulting supernatant was clear. Next pyridine was added as before and the mixture was stirred at 80° C. for 24 hours. Problems arose when the exchanged solution was washed with hexane (as before) and centrifuged to obtain a plug. Despite centrifuging at much greater rates than in Example 1, only a very small plug could be obtained. In fact, exposing the supernatant to UV light revealed that the majority of quantum dots remained in solution (greater than 75%).

Example 2 illustrates the difficulty of isolating quantum dots. Many of the quantum dots are lost because they cannot be readily separated from the solvent they are formed in. This leads to a very inefficient process. Efficiency can be improved dramatically, as illustrated in Example 1, by connecting the quantum dots to nanoparticles to form new light-emitting nanocomposite particles. As is well known in the art, the effectiveness of separating nanoparticles from a solvent scales as the surface area of the nanoparticles. The invented means for increasing the surface area is to grow nanoparticles (such as nanowires) on the surfaces of the quantum dots, resulting in nanocomposites with greatly enhanced surface areas. An additional benefit of this process is that the electrical connection between the nanoparticles and the quantum dots is enhanced as a result of the nanocomposite growth procedure. The nanocomposite particles can be used to form a light-emitting layer. Annealing the layer forms a semiconductor matrix with embedded quantum dots.

It should be noted that the above experiments provide indirect proof that some of the ZnSe nanowires were growing on the surfaces of the CdSe/ZnSeS quantum dots. As discussed above, following the pyridine exchange the quantum dots could be successfully crashed out of the hexane only after formation of the nanocomposites. If the nanocomposites only contained separated quantum dots and ZnSe nanowires, then only the ZnSe nanowires would crash out of the solution (which indeed occurred in our early experimentation attempts).

Embodiments of the present invention may provide light-emitting materials with enhanced light emission, improved stability, lower resistance, reduced cost, and improved manufacturability. The invention has been described in detail with particular reference to certain preferred embodiments thereof, but it will be understood that variations and modifications can be effected within the spirit and scope of the invention.

PARTS LIST

100 core/shell quantum dot
102 core of core/shell quantum dot
104 shell of core/shell quantum dot
106 organic ligand
108 nanoparticle nucleus
110 nanoparticle nuclei aggregate
112 nanocomposite particle
112A quantum dot portion of a nanocomposite particle
112B nanoparticle portion of a nanocomposite particle
116A free nanoparticle
116B free nanowire
118 nanocomposite particle
120 light-emitting layer
122 Electroluminescent LED
124 light-emitting layer after annealing
126 substrate
128 anode
130 cathode
132 bus metal
134 Electroluminescent LED with transport layers
136 p-type transport layer
138 n-type transport layer
230 semiconductor matrix
240 inorganic nanoparticles
250 inorganic light emitting layer

The invention claimed is:

1. A method of making an inorganic light emitting layer comprising:

(a) combining a solvent for conductive semiconductor nanoparticle growth, a solution of core/shell semiconductor quantum dots, and semiconductor nanoparticle precursor(s), selected to provide a conductive path for electrons and holes through the conductive semiconductor nanoparticles and into the core/shell quantum dots;

(b) growing conductive semiconductor nanoparticles to form a crude solution of core/shell semiconductor quantum dots, conductive semiconductor nanoparticles, and conductive semiconductor nanoparticles that are connected to the core/shell semiconductor quantum dots;

(c) forming a single colloidal dispersion of core/shell semiconductor quantum dots, conductive semiconductor nanoparticles, and conductive semiconductor nanoparticles that are connected to the core/shell semiconductor quantum dots;

(d) depositing the colloidal dispersion to form a film; and (e) annealing the film to form the inorganic light emitting layer that provides a conductive path for electrons and holes from the edges of the inorganic light emitting layer, through the conductive semiconductor nanoparticles and into the core/shell quantum dots.

2. The method of claim 1 wherein the solvent for semiconductor nanoparticle growth is a coordinating solvent.

3. The method of claim 1 wherein step (a) comprises combining the solvent for semiconductor nanoparticle growth with the core/shell semiconductor quantum dots and a first precursor, heating to a temperature of 100° C. or greater, and adding a second semiconductor precursor.

4. The method of claim 1 wherein the growing step includes heating, subjecting the mixture to elevated pressures, or providing microwave energy to the mixture, or combinations thereof.

5. The method of claim 1 further including performing a ligand exchange to cover the surface of the core/shell semiconductor quantum dots, conductive semiconductor nanoparticles, and conductive semiconductor nanoparticles that are connected to the core/shell semiconductor quantum dots with organic ligands whose boiling point is below 200° C.

6. The method of claim 1 wherein the cores of the core/shell semiconductor quantum dots comprise a type IV, III-V, IV-VI, or II-VI semiconductor material.

7. The method of claim 1 wherein the conductive semiconductor nanoparticles connected to core/shell semiconductor quantum dots comprise a first semiconductor material and the shells of the core/shell semiconductor quantum dots comprise a second semiconductor material and wherein the bandgap energy levels of the first semiconductor material are within 0.2 eV of the bandgap energy levels of the second semiconductor material.

8. The method of claim 1 wherein the shells of the core/shell semiconductor quantum dots comprise type IV, III-V, IV-VI, or II-VI semiconductor material.

9. The method of claim 1 wherein the core/shell semiconductor quantum dots include cores containing $Cd_xZn_{1-x}Se$, where x is between 0 and 1, and shells containing elements selected from the group consisting of Zn, S, and Se or combinations thereof.

10. The method of claim 1 wherein the core/shell semiconductor quantum dots include a shell of sufficient thickness so as to confine a conduction band electron or valence band hole to the core region and wherein, when so confined, the wave function of the electron or hole does not extend to the surface of the core/shell semiconductor quantum dot.

11. The method of claim 1 wherein the conductive semiconductor nanoparticles connected to core/shell semiconductor quantum dots comprise type IV, III-V, IV-VI, or II-VI semiconductor material.

12. The method of claim 1 wherein the conductive semiconductor nanoparticles connected to core/shell semiconductor quantum dots comprise conductive nanowires wherein the conductive nanowires have an average diameter of less than 20 nm and an aspect ratio greater than 10.

13. The method of claim 12 wherein the conductive nanowires have an average diameter of less than 5 nm and an aspect ratio greater than 30.

14. The method of claim 1 further including the step of adding a second colloidal dispersion comprising semiconductor nanowires to the single colloidal dispersion.

15. The method of claim 1 wherein the annealing step includes a first annealing step at a temperature between 120° C. and 220° C. for a time up to 60 minutes and a second annealing step at a temperature between 250° C. and 400° C. for a time up to 60 minutes.

* * * * *